(12) United States Patent
Nakayama et al.

(10) Patent No.: US 9,568,835 B2
(45) Date of Patent: Feb. 14, 2017

(54) EXPOSURE APPARATUS WITH IRRADIATION DEVICE FOR IRRADIATING OPTICAL ELEMENT WITH PULSED LIGHT HAVING INFRARED WAVELENGTH, AND CORRESPONDING EXPOSURE METHOD

(71) Applicant: CANON KABUSHIKI KAISHA, Tokyo (JP)

(72) Inventors: Takahiro Nakayama, Albany, NY (US); Akira Miyake, Nasukarasuyama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 33 days.

(21) Appl. No.: 13/964,259

(22) Filed: Aug. 12, 2013

(65) Prior Publication Data
US 2014/0055765 A1    Feb. 27, 2014

(30) Foreign Application Priority Data

Aug. 21, 2012  (JP) .................................. 2012-182635

(51) Int. Cl.
G03F 7/20    (2006.01)

(52) U.S. Cl.
CPC ....... *G03F 7/70191* (2013.01); *G03F 7/70908* (2013.01); *G03F 7/70916* (2013.01); *G03F 7/70925* (2013.01)

(58) Field of Classification Search
CPC .............. G03F 7/70908; G03F 7/70916; G03F 7/70925
See application file for complete search history.

(56) References Cited

U.S. PATENT DOCUMENTS

| 6,924,492 B2* | 8/2005 | Van Schaik ......... G03F 7/70925 250/492.1 |
| 7,095,479 B2 | 8/2006 | Stevens et al. |

(Continued)

FOREIGN PATENT DOCUMENTS

| JP | 2002-270501 A | 9/2002 |
| JP | 2004207730 A | 7/2004 |

(Continued)

OTHER PUBLICATIONS

Office Action issued in Japanese Application No. JP2012-182635 mailed May 30, 2016.

*Primary Examiner* — Steven H Whitesell Gordon
*Assistant Examiner* — Michelle M Iacoletti
(74) *Attorney, Agent, or Firm* — Rossi, Kimms & McDowell LLP

(57) ABSTRACT

The present invention provides an exposure apparatus for exposing a shot on a substrate to first pulsed light, the apparatus including an optical element for guiding the first pulsed light to the substrate, an irradiation device configured to irradiate the optical element with second pulsed light having an infrared wavelength which the first pulsed light has less than the second pulsed light has, and a controller configured to control the irradiation device in a process of exposing the shot to the first pulsed light plural times, such that the irradiation device irradiates the optical element with the second pulsed light during at least one period of non-irradiation periods in which the shot is not irradiated with the first pulsed light.

33 Claims, 6 Drawing Sheets

(56) References Cited

U.S. PATENT DOCUMENTS

| | | |
|---|---|---|
| 7,670,754 B2 | 3/2010 | Edo et al. |
| 2002/0134947 A1 | 9/2002 | Van Schaik |
| 2010/0192973 A1* | 8/2010 | Ueno et al. .................... 134/1.1 |
| 2011/0262866 A1* | 10/2011 | Nakayama .......... G03F 7/70925 |
| | | 430/311 |
| 2013/0026393 A1* | 1/2013 | Abe et al. ................. 250/504 R |

FOREIGN PATENT DOCUMENTS

| | | |
|---|---|---|
| JP | 2005166970 A | 6/2005 |
| JP | 2010186995 A | 8/2010 |
| WO | 99/05708 A1 | 2/1999 |
| WO | 2011/057906 A1 | 5/2011 |

\* cited by examiner

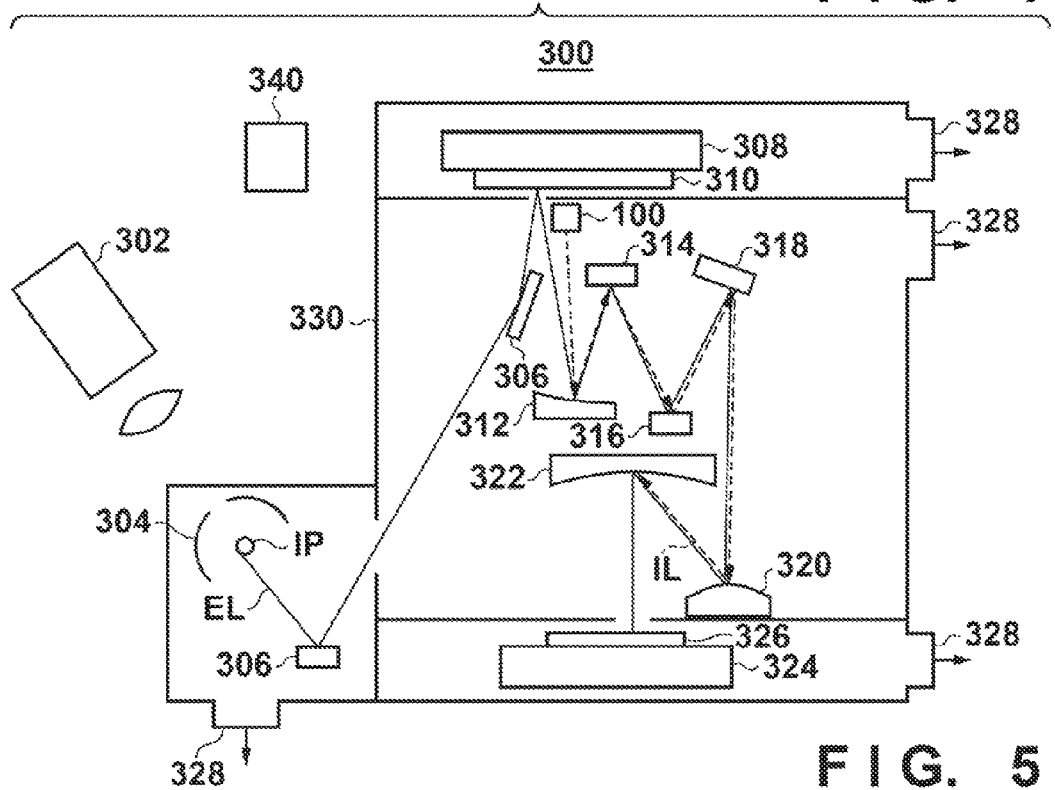
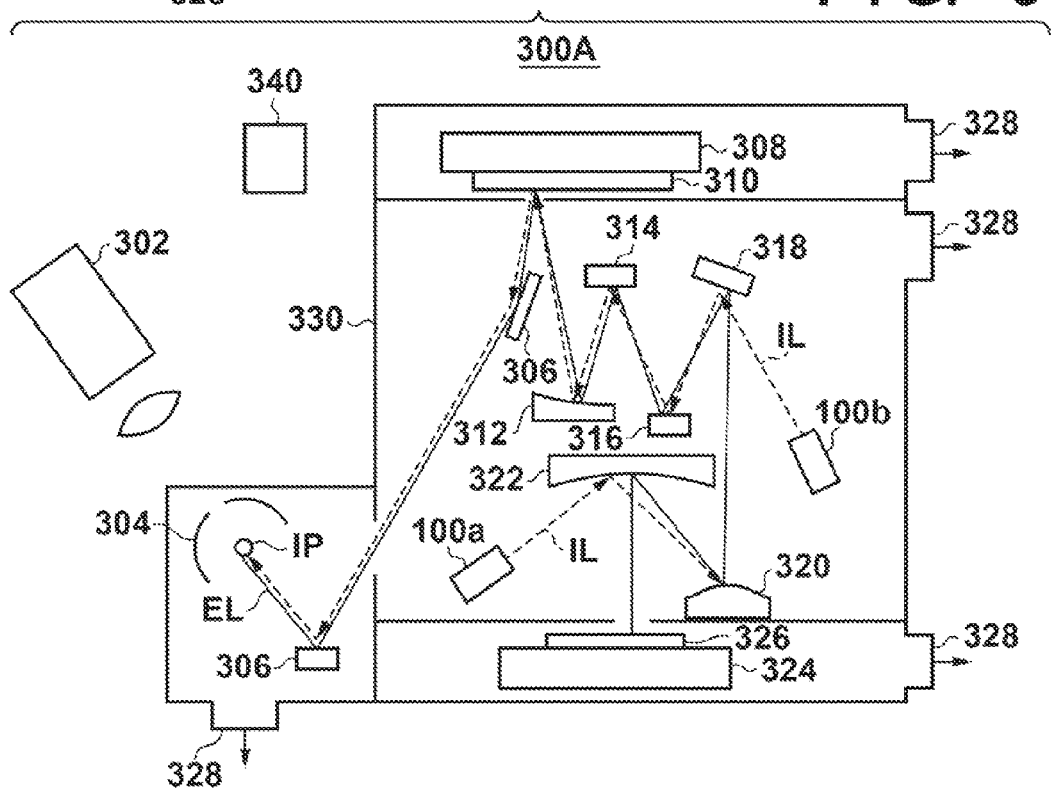

EXPOSURE APPARATUS WITH IRRADIATION DEVICE FOR IRRADIATING OPTICAL ELEMENT WITH PULSED LIGHT HAVING INFRARED WAVELENGTH, AND CORRESPONDING EXPOSURE METHOD

BACKGROUND OF THE INVENTION

Field of the Invention

The present invention relates to an exposure apparatus, exposure method, and method of manufacturing an article.

Description of the Related Art

Upon manufacturing a semiconductor device, liquid crystal display device, or the like, an exposure apparatus including an illumination optical system which illuminates a reticle (mask) pattern with light, and a projection optical system which projects the reticle pattern onto a substrate is used.

In the exposure apparatus, after repetition of exposure processes, materials vaporized from a resist applied to a substrate and an outgas from components deposit (are absorbed) on surfaces of optical elements of the illumination optical system and projection optical system and react with exposure light, thus contaminating the surfaces of the optical elements (contamination). Thus, a technique for removing (cleaning) contaminants by irradiating the optical elements with infrared light or radiation is proposed by Japanese Patent Laid-Open No. 2002-270501.

However, since this related art requires a step of removing a material adhered on the surfaces of the optical elements in addition to a step of exposing a substrate to light, a down time is generated in the exposure apparatus, thus lowering the throughput. Also, when the optical elements are irradiated with infrared light, they absorb the infrared light, and their temperatures rise, thus causing thermal deformations of the optical elements.

SUMMARY OF THE INVENTION

The present invention provides, for example, an exposure apparatus which is advantageous in reduction of contamination of an optical element thereof.

According to one aspect of the present invention, there is provided an exposure apparatus for exposing a shot on a substrate to first pulsed light, the apparatus including an optical element for guiding the first pulsed light to the substrate, an irradiation device configured to irradiate the optical element with second pulsed light having an infrared wavelength which the first pulsed light has less than the second pulsed light has, and a controller configured to control the irradiation device in a process of exposing the shot to the first pulsed light plural times, such that the irradiation device irradiates the optical element with the second pulsed light during at least one period of non-irradiation periods in which the shot is not irradiated with the first pulsed light.

Further aspects of the present invention will become apparent from the following description of exemplary embodiments with reference to the attached drawings.

BRIEF DESCRIPTION OF THE DRAWINGS

FIG. 4 is a schematic view showing the arrangement of an exposure apparatus according to the first embodiment of the present invention.

FIG. 5 is a schematic view showing the arrangement of an exposure apparatus according to the second embodiment of the present invention.

DESCRIPTION OF THE EMBODIMENTS

Figure 1:
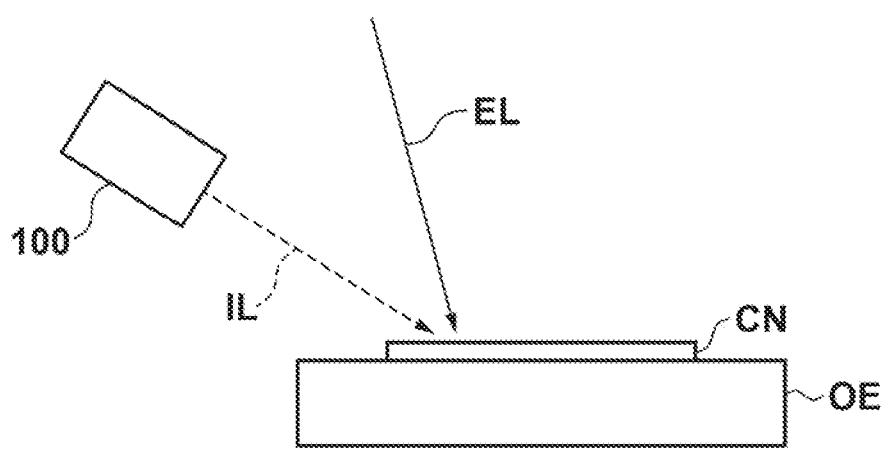
FIG. 1 is a schematic partial view showing the arrangement of an exposure apparatus according to one aspect of the present invention.

Preferred embodiments of the present invention will be described below with reference to the accompanying drawings. Note that the same reference numerals denote the same members throughout the drawings, and a repetitive description thereof will not be given.

An overview of the present invention will be described below with reference to FIG. 1. FIG. 1 is a schematic partial view showing the arrangement of an exposure apparatus according to one aspect of the present invention.

Referring to FIG. 1, reference symbol EL denotes exposure pulsed light (first pulsed light) having a wavelength that exposes a resist (photosensitive material) applied on a substrate to light, and reference symbol IL denotes infrared pulsed light (second pulsed light) having an infrared wavelength. Also, reference symbol OE denotes an optical element (multilayer mirror or the like) which guides the exposure light EL to the substrate, and reference symbol CN denotes a contaminant as a cause of a contamination on the (surface of the) optical element OE.

The exposure pulsed light EL is pulsed light which is generated by an excimer light source, lamp light source, plasma light source, synchrotron light source, or the like, and has a wavelength which is not less than 1 nm and less than 450 nm. The infrared pulsed light IL is pulsed light which is irradiated from an irradiation unit 100 including a lamp light source, laser light source, or the like, and has a wavelength which is not less than 0.7 µm and is not more than 1 mm. Also, the infrared pulsed light IL may be pulsed light including a plurality of wavelengths.

The contaminant CN is a material which is contained in an exposure atmosphere and temporarily or stably stays on the surface of the optical element OE. Such material includes, for example, siloxane, hydrocarbon, NOx, SOx, $H_2O$, $O_2$, $H_2$, carbon dioxide, and the like. The optical element OE is configured by one or a combination of a single-crystalline material, polycrystalline material, amorphous material, and multilayer material.

Figure 2A:
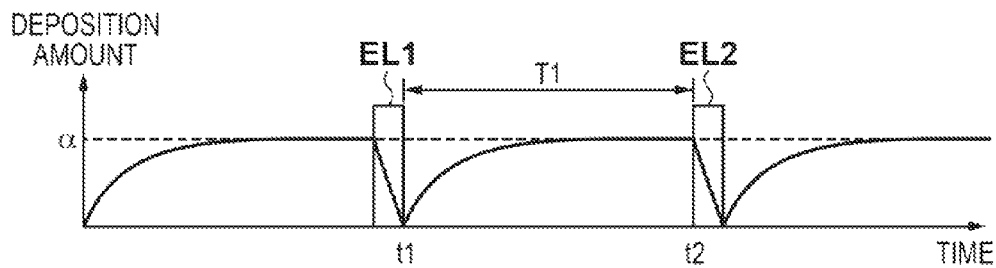
FIGS. 2A to 2C are graphs showing temporal changes of the deposition amount of a contaminant that deposits (adheres) on an optical element of the exposure apparatus shown in FIG. 1.

In a process of exposing a substrate to light (exposure process), the optical element OE is irradiated with the exposure pulsed light EL intermittently (that is, in a pulsed manner). In the exposure process, as shown in FIG. 2A, as time elapses, the deposition amount of the contaminant CN, which is deposited on the optical element OE, increases, and approaches asymptotically to a certain deposition amount α. FIG. 2A is a graph showing a temporal change in deposition amount of the contaminant CN that deposits (adheres) on the optical element OE.

Referring to FIG. 2A, the deposition amount of the contaminant CN approaches asymptotically to the certain deposition amount α during an interval T1 between a first irradiation end time t1 of exposure pulsed light EL1 and a second irradiation start time t2 of exposure pulsed light EL2. The period T1 is a non-irradiation period of the exposure pulsed light EL. Then, as a result of irradiation of the exposure pulsed light EL, the contaminant CN adheres on the (surface of the) optical element OE. Therefore, the deposition amount of the contaminant CN decreases while the optical element OE is irradiated with the exposure pulsed light EL, and increases again after the irradiation of the exposure pulsed light EL ends.

Figure 2B:
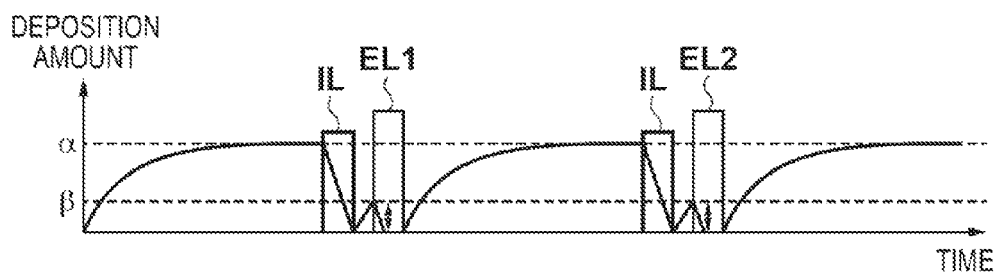

FIG. 2B is a graph showing a temporal change in deposition amount of the contaminant CN when the optical element OE is irradiated with the infrared pulsed light IL. Upon irradiation of the infrared pulsed light IL, since the contaminant CN can be removed from the optical element OE, the deposition amount of the contaminant CN decreases. However, upon completion of irradiation of the infrared pulsed light IL, the deposition amount of the contaminant CN increases again. Then, for example, when the deposition amount of the contaminant CN is a deposition amount β smaller than the deposition amount α, the optical element OE is irradiated with the exposure pulsed light EL (EL1, EL2). As a result, when the optical element OE is irradiated with the infrared pulsed light IL (FIG. 2B), the amount (adhered amount) of the contaminant CN can be smaller than that obtained when the optical element OE is not irradiated with the infrared pulsed light IL (FIG. 2A).

Figure 2C:
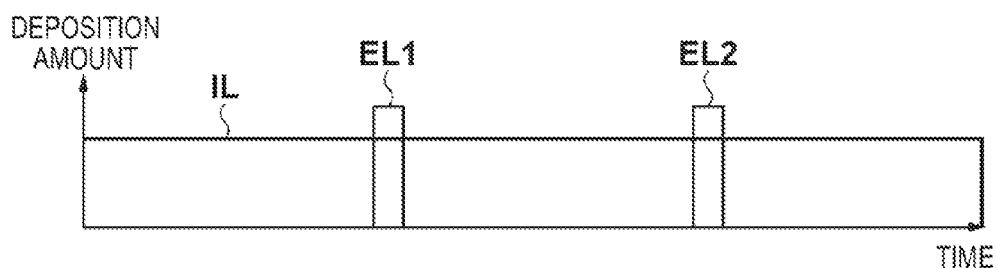

On the other hand, as shown in FIG. 2C, when the optical element OE is kept irradiated with the infrared pulsed light IL, the contaminant CN can be prevented from depositing on the optical element OE. However, the temperature of the optical element OE rises, thus causing a thermal deformation of the optical element OE.

Hence, the present invention intermittently irradiates the optical element OE with the infrared pulsed light IL so as to reduce irradiation of the infrared pulsed light IL to a minimum necessary level, thus suppressing temperature rises of the optical element OE and adhesion of the contaminant CN to the optical element OE.

Figure 3:
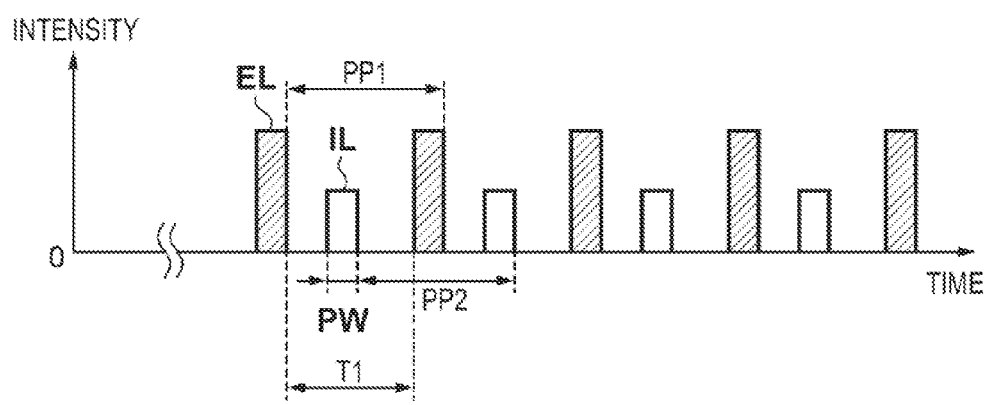
FIG. 3 is a graph showing the irradiation timings of infrared pulsed light according to the present invention.

FIG. 3 shows the irradiation timings of the infrared pulsed light IL according to the present invention. As shown in FIG. 3, a pulse width PW of the infrared pulsed light IL is smaller than an irradiation period PP1 of the exposure pulsed light EL. Also, reference numeral PP2 denotes an irradiation period of the infrared pulsed light IL. In the present invention, the optical element OE is irradiated with the infrared pulsed light IL at a timing during a non-irradiation interval T1 in which a substrate is not irradiated with the exposure pulsed light EL. In this manner, according to the present invention, in a process for exposing the substrate to light by irradiating the substrate with the exposure pulsed light EL a plurality of times (exposure process), the optical element OE is irradiated with the infrared pulsed light IL during the non-irradiation interval T1 in which the substrate is not irradiated with the exposure pulsed light EL.

In FIG. 3, the optical element OE is irradiated with the infrared pulsed light IL once during one non-irradiation interval T1, but it may be irradiated with the infrared pulsed light IL a plurality of times. However, even when the optical element OE is irradiated with the infrared pulsed light IL a plurality of times, a continuous irradiation state of the infrared pulsed light IL (FIG. 2C) during the non-irradiation interval T1 has to be prevented from being set. For example, the optical element OE is not irradiated with the infrared pulsed light IL during a half interval of one non-irradiation interval T1.

In FIG. 3, the irradiation period PP2 of the infrared pulsed light IL is constant. However, the irradiation period PP2 of the infrared pulsed light IL may be a random period. Furthermore, in FIG. 3, the intensities (light intensities) of the infrared pulsed light IL and exposure pulsed light EL are temporally constant, but they may be changed temporally.

On the other hand, the optical element OE may be irradiated with infrared pulsed light IL during a latter half interval of one non-irradiation interval T1, for example, immediately before irradiation of the exposure pulsed light EL. As described above, upon completion of irradiation of the infrared pulsed light IL, the deposition amount of the contaminant CN begins to increase. Therefore, as an interval from the irradiation end timing of the infrared pulsed light IL until the irradiation start timing of the exposure pulsed light EL is shorter, the deposition amount of the contaminant CN can be reduced. In other words, the amount of the contaminant CN that adheres on the optical element OE can be reduced. Hence, by irradiating the optical element OE with the infrared pulsed light IL during a latter half interval of one non-irradiation interval T1 (immediately before irradiation of the exposure pulsed light EL), the amount of the contaminant CN that adheres on the optical element OE can be minimized.

Also, in FIG. 3, the optical element OE is irradiated with the infrared pulsed light IL respectively in the non-irradiation intervals T1 (all the non-irradiation intervals T1), thus minimizing the amount of the contaminant CN that adheres on the optical element OE. However, even when the optical element OE is irradiated with the infrared pulsed light IL during at least one of the non-irradiation intervals T1, the amount of the contaminant CN that adheres on the optical element OE can be reduced compared to the related art.

First Embodiment

FIG. 4 is a schematic view showing the arrangement of an exposure apparatus 300 according to the first embodiment of the present invention. The exposure apparatus 300 is a lithography apparatus which transfers a reticle (mask) pattern onto a substrate by a step-and-scan method or step-and-repeat method.

The exposure apparatus 300 includes a laser source 302, a focusing mirror 304, a multilayer mirror 306, a reticle stage 308 which holds a reticle 310, and first to sixth multilayer mirrors 312 to 322. The exposure apparatus 300 includes a substrate stage 324 which holds a substrate 326, an evacuation system 328, a vacuum chamber 330, a control unit 340, and an irradiation unit 100.

The laser source 302 irradiates an emission point IP with laser light. Exposure pulsed light EL (for example, X-rays) emitted by the emission point IP is focused by the focusing mirror 304, and irradiates the reticle 310 held by the reticle stage 308 via the multilayer mirror 306 included in an illumination optical system.

The exposure pulsed light EL reflected by the reticle 310 becomes incident on the first multilayer mirror 312, and is reflected by the first multilayer mirror 312. The exposure pulsed light EL from the first multilayer mirror 312 is reflected in turn by the second multilayer mirror 314, third multilayer mirror 316, fourth multilayer mirror 318, fifth multilayer mirror 320, and sixth multilayer mirror 322, and then becomes incident on the substrate 326 held by the substrate stage 324. The first to sixth multilayer mirrors 312 to 322 configure a projection optical system which projects a pattern of the reticle 310 onto the substrate 326.

The multilayer mirror 306 (illumination optical system) and the first to sixth multilayer mirrors 312 to 322 (projection optical system) are housed in the vacuum chamber 330, the internal pressure of which can be maintained at 1 Pa or less by evacuation via the evacuation system 328.

The control unit 340 includes a CPU, memory, and the like, and controls the overall (operations of) exposure apparatus 300. For example, the control unit 340 controls the relationship between the irradiation timings of the exposure pulsed light EL onto the substrate 326 and those of the infrared pulsed light IL onto the respective multilayer mirrors to be that shown in FIG. 3.

In the exposure apparatus 300, after repetition of exposure processes, a material that contains carbon deposits on the surfaces of the multilayer mirror 306 and the first to sixth multilayer mirrors 312 to 322 housed in the vacuum chamber 330, and reacts with the exposure pulsed light EL so as to be adhered as a contaminating material. Such contaminating material is called a contaminant, and is caused by a carbon compound vaporized from the resist and an outgas from components of the exposure apparatus 300.

The contaminant considerably lowers the reflectance of an optical element (multilayer mirror) with respect to the exposure pulsed light EL. Hence, in this embodiment, the control unit 340 controls the irradiation unit 100 so as to irradiate each multilayer mirror with the infrared pulsed light IL during at least one interval of non-irradiation intervals in which the substrate 326 is not irradiated with the exposure pulsed light EL, as described above. In other words, in the exposure apparatus 300, in the exposure process, the multilayer mirrors are intermittently irradiated with the infrared pulsed light IL, thus suppressing or reducing the temperature rises of the respective multilayer mirrors and adhesion of the contaminant CN onto the respective multilayer mirrors.

In this embodiment, as shown in FIG. 4, the irradiation unit 100 which irradiates the infrared pulsed light IL is arranged in the vicinity of the reticle 310. However, the irradiation unit 100 may be arranged at another position as long as it does not block the exposure pulsed light EL. In place of arranging the irradiation unit 100, light having a wavelength longer than that of the exposure pulsed light EL may be extracted from light emitted by the laser source 302 or emission point IP, and such light may be used as infrared pulsed light IL.

Second Embodiment

FIG. 5 is a schematic view showing the arrangement of an exposure apparatus 300A according to the second embodiment of the present invention. The exposure apparatus 300A includes a plurality of irradiation units (first and second irradiation units 100a and 100b) which respectively irradiate infrared pulsed light IL unlike in the exposure apparatus 300. When a plurality of optical elements (a multilayer mirror 306 and first to sixth multilayer mirrors 312 to 322) are irradiated with infrared pulsed light IL using only one irradiation unit which irradiates the infrared pulsed light IL, a substrate 326 is inevitably irradiated with the infrared pulsed light IL. Hence, in this embodiment, the plurality of irradiation units are used to allow to freely set incidence directions of the infrared pulsed light IL which becomes incident respectively on the plurality of optical elements. Therefore, the substrate 326 can be prevented or reduced from being irradiated with the infrared pulsed light IL.

As shown in FIG. 5, the first irradiation unit 100a emits infrared pulsed light IL so that the infrared pulsed light IL reflected by the sixth multilayer mirror 322 travels in a direction opposite to the incidence direction of exposure pulsed light EL which becomes incident on the sixth multilayer mirror 322. The second irradiation unit 100b emits infrared pulsed light IL so that the infrared pulsed light IL reflected by each of the fifth to first multilayer mirrors 320 to 312 and multilayer mirror 306 travels in a direction opposite to the incidence direction of the exposure pulsed light EL which becomes incident on the corresponding multilayer mirror. In this way, the first and second irradiation units 100a and 100b are arranged to prevent the substrate 326 from being irradiated with the infrared light IL reflected by the respective multilayer mirrors. Also, the exposure apparatus 300A intermittently irradiates the multilayer mirrors with the infrared pulsed light IL in the exposure process, thus suppressing or reducing the temperature rises of the respective multilayer mirrors and adhesion of a contaminant CN on the respective multilayer mirrors as in the above description.

Therefore, the exposure apparatus 300A can prevent or eliminate the substrate 326 from being irradiated with the infrared pulsed light IL and the reflectance of each multilayer mirror from lowering due to adhesion of the contaminant CN. Also, this embodiment has exemplified the case in which the number of irradiation units which irradiate the infrared pulsed light IL is two. Alternatively, three or more irradiation units may be arranged as long as they do not block the exposure pulsed light EL.

Third Embodiment

Figure 6:
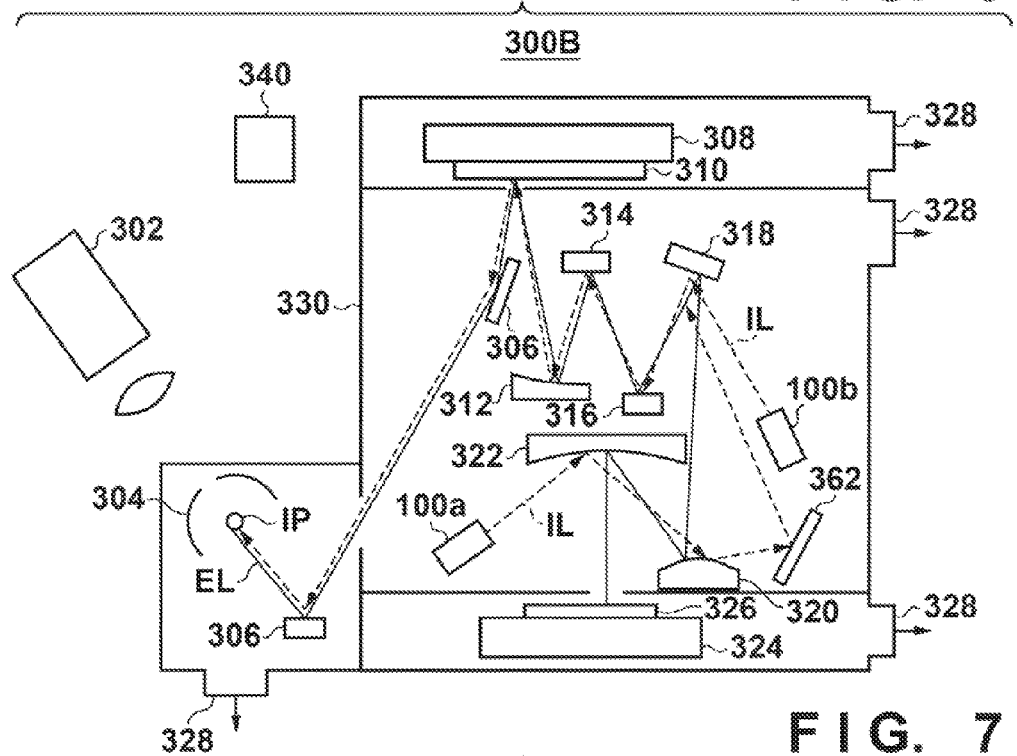
FIG. 6 is a schematic view showing the arrangement of an exposure apparatus according to the third embodiment of the present invention.

FIG. 6 is a schematic view showing the arrangement of an exposure apparatus 300B according to the third embodiment of the present invention. The exposure apparatus 300B includes an optical member 362 used to guide infrared pulsed light IL reflected by optical elements (sixth and fifth multilayer mirrors 322 and 320) to an exposure light source (emission point IP) which emerges exposure pulsed light EL unlike in the exposure apparatus 300A. When other components housed in a vacuum chamber 330 are irradiated with infrared pulsed light IL reflected by optical elements (a multilayer mirror 306 and first to sixth multilayer mirrors 312 to 322) which guide the exposure pulsed light EL to a substrate 326, the temperatures of these components unwantedly rise. Hence, in this embodiment, since the optical member 362 used to guide the infrared pulsed light IL to the exposure light source is arranged, the infrared light IL reflected by the optical elements becomes incident on the exposure light source. Therefore, the temperature rises of the components (other components housed in the vacuum chamber 330) due to irradiation with the infrared light IL reflected by the optical elements can be prevented or reduced.

In this embodiment, the optical member 362 is an reflective optical member which reflects the infrared pulsed light IL, and is arranged at a position where it does not block the exposure pulsed light EL. As shown in FIG. 6, the infrared light IL coming from a first irradiation unit 100a is reflected in turn by the sixth and fifth multilayer mirrors 322 and 320. The infrared light IL reflected by the fifth multilayer mirror 320 is reflected by the optical member 362, and is guided to the vicinity of the emission point IP via the fourth to first multilayer mirrors 318 to 312 and the multilayer mirror 306. On the other hand, infrared pulsed light IL emitted from a second irradiation unit 100b is guided to the vicinity of the emission point IP via the fourth to first multilayer mirrors 318 to 312 and the multilayer mirror 306. In this manner, when the infrared pulsed light IL can be guided to the vicinity of the emission point IP by only optical elements included in an illumination optical system and projection optical system, the need for arrangement of a new member such as the optical member 362 can be obviated. Also, the exposure apparatus 300B intermittently irradiates the multilayer mirrors with the infrared pulsed light IL in the exposure process, thus suppressing or reducing the temperature rises of the respective multilayer mirrors and adhesion of a contaminant CN on the respective multilayer mirrors as in the above description.

Therefore, the exposure apparatus 300B can prevent or eliminate the substrate 326 from being irradiated with the infrared pulsed light IL and the reflectance of each multilayer mirror from lowering due to adhesion of the contaminant CN. Also, this embodiment has exemplified the case in which one optical member 362 is used to guide the infrared pulsed light IL reflected by the multilayer mirrors to the exposure light source. Alternatively, a plurality of optical members 362 may be arranged as long as they do not block the exposure pulsed light EL.

Fourth Embodiment

Figure 7:
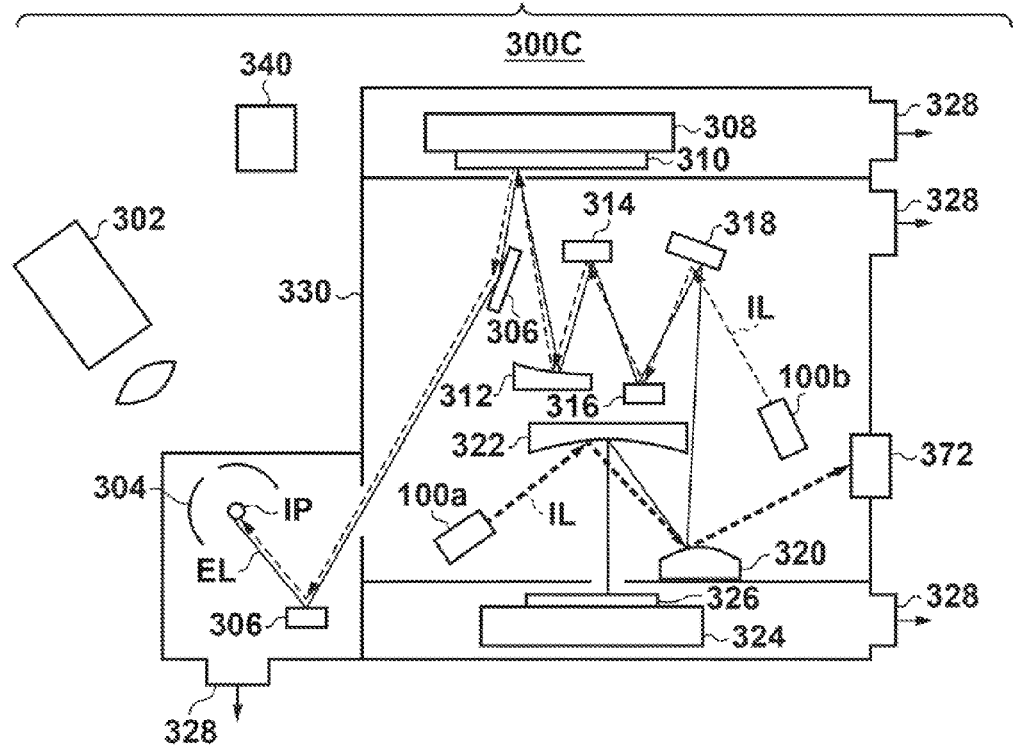
FIG. 7 is a schematic view showing the arrangement of an exposure apparatus according to the fourth embodiment of the present invention.

FIG. 7 is a schematic view showing the arrangement of an exposure apparatus 300C according to the fourth embodiment of the present invention. The exposure apparatus 300C includes an absorbing unit (absorbing member) 372 which absorbs infrared pulsed light IL reflected by optical elements (sixth and fifth multilayer mirrors 322 and 320) unlike in the exposure apparatus 300A. Other components housed in a vacuum chamber 330 may often be irradiated with infrared pulsed light IL reflected by optical elements (a multilayer mirror 306 and first to sixth multilayer mirrors 312 to 322) used to guide exposure pulsed light EL to a substrate 326. In such case, the substrate 326 may be irradiated with the infrared pulsed light IL reflected by these components. Thus, in this embodiment, the absorbing unit 372 which absorbs the infrared pulsed light IL is arranged at an irradiation position of the infrared pulsed light IL reflected by the optical elements in the vacuum chamber, thereby absorbing the infrared pulsed light IL reflected by the optical elements. Therefore, the infrared pulsed light IL reflected by the optical elements can be prevented from being further reflected by other components housed in the vacuum chamber 330 and becoming incident on the substrate 326, or the occurrence of such in conveniences can be reduced.

In this embodiment, the absorbing unit 372 is arranged in the vacuum chamber 330 to absorb the infrared pulsed light IL. The absorbing unit 372 is made up of a material which absorbs the infrared pulsed light IL, for example, graphite, silicon, aluminum nitride, or the like. As shown in FIG. 7, the infrared light IL coming from a first irradiation unit 100a is reflected in turn by the sixth and fifth multilayer mirrors 322 and 320, and is absorbed by the absorbing unit 372. On the other hand, the infrared pulsed light IL emitted by a second irradiation unit 100b is guided to the vicinity of an emission point IP via the four to first multilayer mirrors 318 to 312 and the multilayer mirror 306. In this manner, when the infrared pulsed light IL reflected by the multilayer mirrors is never reflected by other components housed in the vacuum chamber 330, the need for arranging the absorbing unit 372 which absorbs the infrared pulsed light IL can be obviated. Also, the exposure apparatus 300C intermittently irradiates the multilayer mirrors with the infrared pulsed light IL in the exposure process, thus suppressing or reducing the temperature rises of the respective multilayer mirrors and adhesion of a contaminant CN on the respective multilayer mirrors as in the above description.

Therefore, the exposure apparatus 300C can prevent the substrate 326 from being irradiated with the infrared pulsed light IL and the reflectance of each multilayer mirror from lowering due to adhesion of the contaminant CN, or reduce the occurrence of such inconveniences. Also, this embodiment has exemplified the case in which one absorbing unit 372 is used to absorb the infrared pulsed light IL reflected by the multilayer mirrors. Alternatively, a plurality of absorbing units 372 may be arranged. Also, the absorbing unit 372 may include a reflection mechanism required to confine the absorbed infrared pulsed light IL.

Fifth Embodiment

Figure 8:
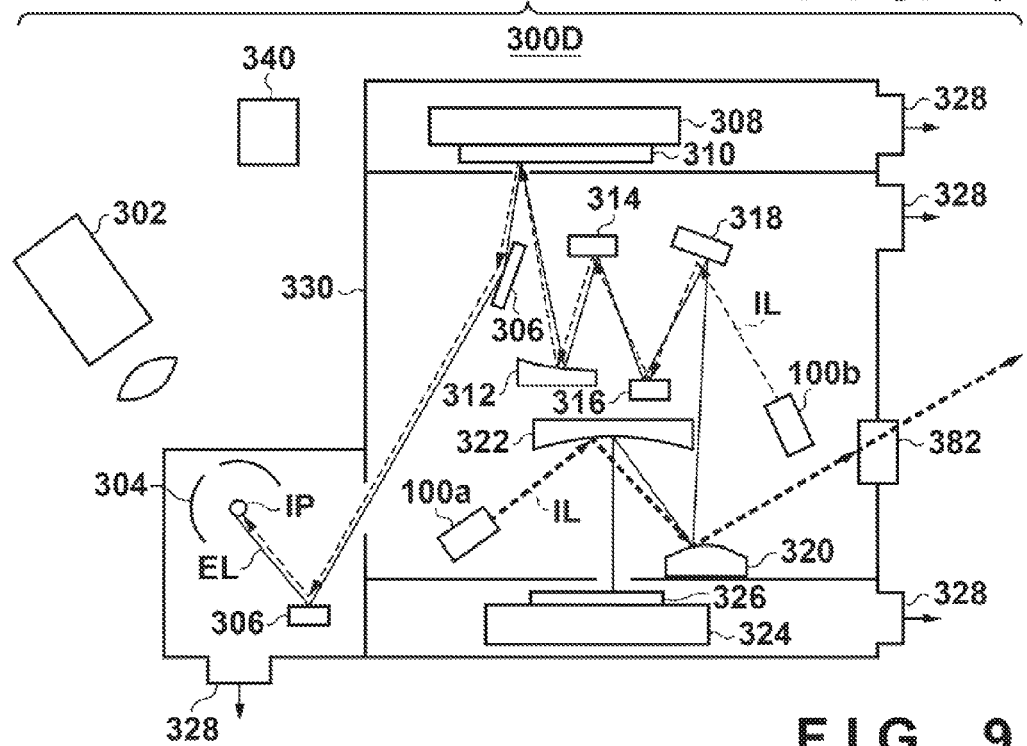
FIG. 8 is a schematic view showing the arrangement of an exposure apparatus according to the fifth embodiment of the present invention.

FIG. 8 is a schematic view showing the arrangement of an exposure apparatus 300D according to the fifth embodiment of the present invention. The exposure apparatus 300D is different from the exposure apparatus 300A in that it includes a transmitting unit 382 which transmits infrared pulsed light IL reflected by optical elements (sixth and fifth multilayer mirrors 322 and 320) to the outside of a vacuum chamber 330 unlike in the exposure apparatus 300A. Other components housed in the vacuum chamber 330 are often irradiated with infrared pulsed light IL reflected by optical elements (a multilayer mirror 306 and first to sixth multilayer mirrors 312 to 322) used to guide exposure pulsed light EL to a substrate 326. In such case, the substrate 326 may be irradiated with the infrared pulsed light IL reflected by these components. Thus, in this embodiment, the transmitting unit 382 which transmits through the infrared pulsed light IL is arranged at an irradiation position of the infrared pulsed light IL reflected by the optical elements, thereby transmitting the infrared pulsed light IL reflected by the optical elements to the outside of the vacuum chamber 330. Therefore, the infrared pulsed light IL reflected by the optical elements can be prevented from being further reflected by other components housed in the vacuum chamber 330 and becoming incident on the substrate 326.

In this embodiment, the transmitting unit 382 is arranged in the vacuum chamber 330 and transmits the infrared pulsed light IL. The transmitting unit 382 is made up of a material which transmits the infrared pulsed light IL, for example, $CaF_2$, LiF, $MgF_2$, $BaF_2$, thallium bromide iodide, thallium bromide chloride, NaCl, KBr, cesium iodide, ZnSe, or the like. As shown in FIG. 8, infrared light IL coming from a first irradiation unit 100a is reflected in turn by the sixth and fifth multilayer mirrors 322 and 320, and is transmitted through the transmitting unit 382, thus letting the infrared light IL to the outside of the vacuum chamber 330. On the other hand, infrared pulsed light IL emitted by a second irradiation unit 100b is guided to the vicinity of an emission point IP via the fourth to first multilayer mirrors 318 to 312 and the multilayer mirror 306. In this manner, when the infrared pulsed light IL reflected by the multilayer mirrors is never reflected by other components housed in the vacuum chamber 330, the need for arranging the transmitting unit 382 which transmits through the infrared pulsed light IL can be obviated. Also, the exposure apparatus 300D intermittently irradiates the multilayer mirrors with the infrared pulsed light IL in the exposure process, thus suppressing or reducing the temperature rises of the respective multilayer mirrors and adhesion of a contaminant CN on the respective multilayer mirrors as in the above description.

Therefore, the exposure apparatus 300D can prevent the substrate 326 from being irradiated with the infrared pulsed light IL and the reflectance of each multilayer mirror from lowering due to adhesion of the contaminant CN, or reduce the occurrence of such inconveniences. Also, this embodiment has exemplified the case in which one transmitting unit 382 is used to transmit through the infrared pulsed light IL reflected by the multilayer mirrors to the outside of the vacuum chamber 330. Alternatively, a plurality of transmitting units 382 may be arranged.

Sixth Embodiment

Figure 9:
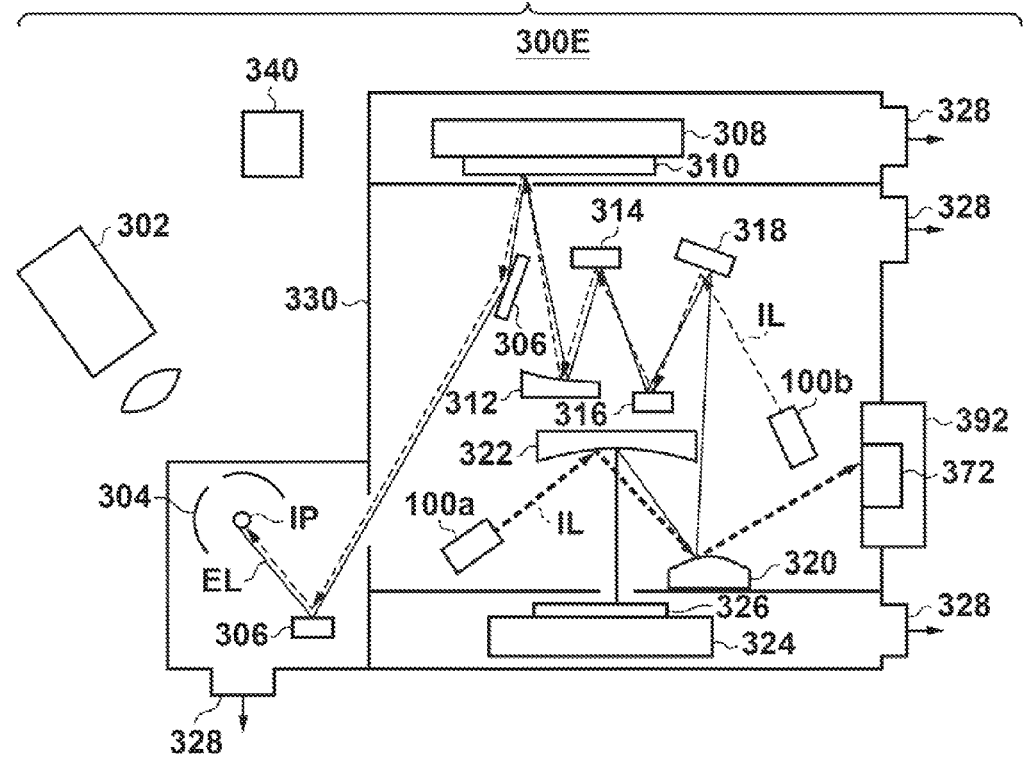
FIG. 9 is a schematic view showing the arrangement of an exposure apparatus according to the sixth embodiment of the present invention.

FIG. 9 is a schematic view showing the arrangement of an exposure apparatus 300E according to the sixth embodiment of the present invention. The exposure apparatus 300E includes a cooling unit 392 for cooling an absorbing unit 372 which absorbs infrared pulsed light IL reflected by optical elements (sixth and fifth multilayer mirrors 322 and 320) unlike in the exposure apparatus 300C. When infrared pulsed light IL reflected by the optical elements is absorbed by the absorbing unit 372, since the temperature of the absorbing unit 372 rises, the temperatures of components housed in a vacuum chamber 330 may also rise due to heat conduction or radiation from the absorbing unit 372. Thus, in this embodiment, the cooling unit 392 for cooling the absorbing unit 372 is arranged, and the temperature control of the absorbing unit 372 is allowed, thus reducing the temperature rise of the absorbing unit 372. Therefore, the temperatures of the components housed in the vacuum chamber 330 can be prevented from rising due to heat conduction or radiation from the absorbing unit 372, or the occurrence of such temperature rise can be reduced.

In this embodiment, the cooling unit 392 is arranged in the vicinity of the absorbing unit 372, for example, to surround the absorbing unit 372. The cooling unit 392 cools the absorbing unit 372 by a circulating water-cooling system using a liquid, a gas circulating cooling system using a gas, a Peltier cooling system using a Peltier element, or a combination thereof. The cooling unit 392 may include an adjustment mechanism for adjusting cooling performance for the absorbing unit 372 and a control mechanism for controlling them. Therefore, the cooling unit 392 can reduce the temperature rise of the absorbing unit 392 due to absorption of the infrared pulsed light IL, so that the temperature of the absorbing unit 372 falls within a predetermined temperature range. Also, the exposure apparatus 300E intermittently irradiates the multilayer mirrors with the infrared pulsed light IL in the exposure process, thus suppressing or reducing the temperature rises of the respective multilayer mirrors and adhesion of a contaminant CN on the respective multilayer mirrors as in the above description.

Therefore, the exposure apparatus 300E can prevent a substrate 326 from being irradiated with the infrared pulsed light IL and the reflectance of each multilayer mirror from lowering due to adhesion of the contaminant CN, or reduce the occurrence of such inconveniences. Also, this embodiment has exemplified the case in which one cooling unit 392 is used to cool the absorbing unit 372. Alternatively, the cooling unit 392 may be arranged in correspondence with the number of absorbing units 372.

Seventh Embodiment

Figure 10:
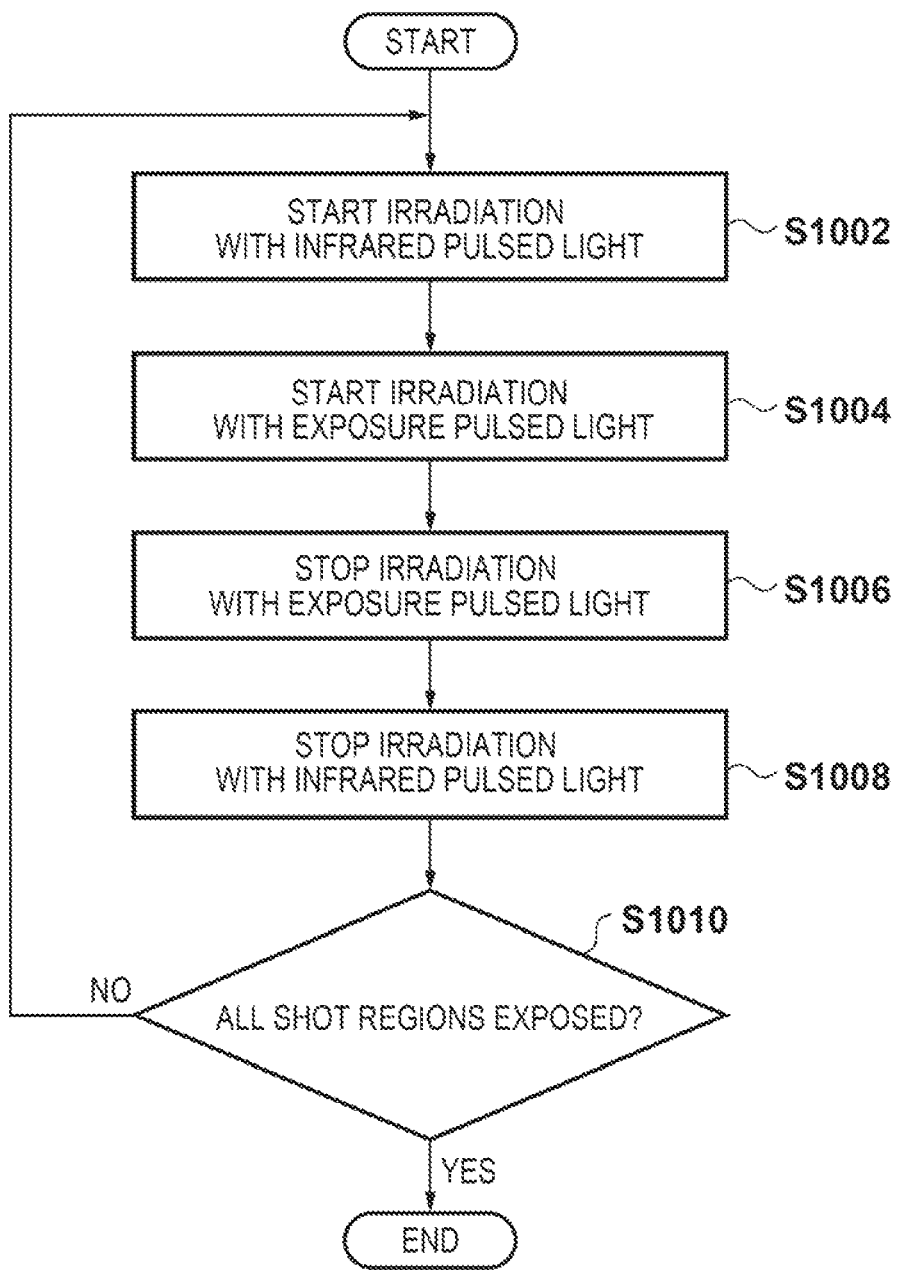
FIG. 10 is a flowchart for explaining an exposure method according to one aspect of the present invention.

FIG. 10 is a flowchart for explaining an exposure method (that is, the operations of the exposure apparatus of each of the aforementioned embodiments) according to one aspect of the present invention. A case will be exemplified below wherein each of a plurality of shot regions on a substrate is exposed to light as a process for exposing the substrate to light (exposure process).

In step S1002, before the beginning of irradiation of a target shot region (a shot region to be exposed) on a substrate with exposure pulsed light, irradiation with infrared pulsed light of optical elements used to guide the exposure pulsed light toward the substrate is started. By irradiating the optical elements with the infrared pulsed light, contaminants that has deposited on the (surfaces of the) optical elements can be removed from the optical elements, as described above. In this case, the optical elements are irradiated with the infrared pulsed light during at least one interval of non-irradiation intervals in which the substrate is not irradiated with the exposure pulsed light, as described above. Note that the irradiation start timing of the optical elements with the infrared pulsed light may be the same as or after the irradiation start timing of the target shot region on the substrate with the exposure pulsed light.

In step S1004, irradiation of the target shot region on the substrate with the exposure pulsed light is started. After irradiation of the target shot region is started with the exposure pulsed light, the target shot region is irradiated with the exposure pulsed light during a predetermined interval, that is, a plurality of times. Even after irradiation of the target shot region with the exposure pulsed light is started, irradiation of the optical elements with the infrared pulsed light, which is started in step S1002, is continued. Therefore, the optical elements are irradiated with the infrared pulsed light during at least one interval of the non-irradiation intervals in which the substrate is not irradiated with the exposure pulsed light.

In step S1006, irradiation of the target shot region with the exposure pulsed light is stopped. When the target shot region is irradiated with the exposure pulsed light during the predetermined interval (a predetermined number of times), emission of the exposure pulsed light is stopped.

In step S1008, irradiation of the optical elements with the infrared pulsed light is stopped. However, the irradiation stop timing of the optical elements with the infrared pulsed light may be the same as or after the irradiation stop timing of the target shot region on the substrate with the exposure pulsed light.

It is determined in step S1010 whether or not all shot regions on the substrate have been exposed to light. If all the shot regions on the substrate have been exposed to light, the operation ends. On the other hand, if shot regions to be exposed on the substrate still remain, the next shot region (shot region to be exposed) is selected as the target shot region, and the process returns to step S1002.

According to the exposure method of this embodiment, the temperature rises of the optical elements and adhesion of contaminants to the optical elements can be suppressed or eliminated. In this embodiment, every time exposure of one shot region on the substrate ends, irradiation with the infrared pulsed light is stopped. However, irradiation (intermittent irradiation) with the infrared pulsed light may be continued until exposure of all the shot regions on the substrate ends (for example, even during step movement).

Eighth Embodiment

A method of manufacturing an article such as a device in this embodiment can include a step of forming a pattern on an object (for example, a substrate applied with a photoresist) using the exposure apparatus of each of the aforementioned embodiments (a step of exposing the object). Also, this manufacturing method can include a step of processing (for example, developing or etching) the object on which the pattern is formed in the above step. Furthermore, this manufacturing method can include other known steps (oxidation, film formation, vapor deposition, doping, planarization, etching, resist removal, dicing, bonding, packaging, etc.). The manufacturing method of an article of this embodiment is advantageous in at least one of performance, quality, productivity, and manufacturing cost of an article compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2012-182635 filed on Aug. 21, 2012, which is hereby incorporated by reference herein in its entirety.

What is claimed is:

1. An exposure apparatus for exposing a shot region on a substrate to first pulsed light, the apparatus comprising:
    a reticle stage configured to hold a reticle;
    a substrate stage configured to hold the substrate;
    an optical element configured to guide the first pulsed light to the substrate;
    an irradiation device configured to irradiate the optical element with second pulsed light having an infrared wavelength; and
    a controller configured to control the irradiation device such that the irradiation device irradiates the optical element with the second pulsed light in a period between successive two of the first pulsed light in a period of exposing the shot region to the first pulsed light plural times,
    wherein the optical element is configured to guide the first pulsed light from the reticle to the substrate.

2. The apparatus according to claim 1, wherein the controller is configured to control the irradiation device such that the irradiation device irradiates the optical element with the second pulsed light before the shot region is irradiated with the first pulsed light.

3. The apparatus according to claim 1, wherein the controller is configured to control the irradiation device such that the irradiation device irradiates the optical element with the second pulsed light during each period between successive two of the first pulsed light.

4. The apparatus according to claim 1, wherein the controller is configured to control the irradiation device such that the irradiation device irradiates the optical element with the second pulsed light once during the period between successive two of the first pulsed light.

5. The apparatus according to claim 4, wherein the controller is configured to control the irradiation device such that the irradiation device irradiates the optical element with the second pulsed light during a latter half period of the period between successive two of the first pulsed light.

6. The apparatus according to claim 1, wherein the optical element is a reflective optical element, and
    the irradiation device is configured to irradiate the optical element with the second pulsed light such that the second pulsed light reflected by the optical element travels in a direction opposite to an incidence direction of the first pulsed light incident on the optical element.

7. The apparatus according to claim 1, wherein the optical element is a reflective optical element, and
    the irradiation device includes an optical member for guiding the second pulsed light reflected by the optical element to a light source which emits the first pulsed light.

8. The apparatus according to claim 1, further comprising a chamber configured to house the optical element,
    wherein the optical element is a reflective optical element, and
    the irradiation device includes an absorbing member arranged in the chamber and configured to absorb the second pulsed light reflected by the optical element.

9. The apparatus according to claim 8, wherein the irradiation device includes a cooling device configured to cool the absorbing member.

10. The apparatus according to claim 1, further comprising a chamber configured to house the optical element,
    wherein the optical element is a reflective optical element, and
    the chamber includes a transmitting portion thereof configured to transmit the second pulsed light reflected by the optical element.

11. An exposure method of exposing a shot region on a substrate to first pulsed light via a projection optical system for projecting a pattern onto the substrate, the method comprising:
    a step of exposing the shot region to light by irradiating the shot region with the first pulsed light plural times via an optical element of the projection optical system,
    wherein the optical element is irradiated with second pulsed light having an infrared wavelength in a period between successive two of the first pulsed light in the step of exposing the shot region to the first pulsed light plural times.

12. The method according to claim 11, wherein the projection optical system projects the pattern of a reticle onto the substrate.

13. A method of manufacturing an article, the method comprising steps of:
    exposing a substrate to light using an exposure apparatus;
    developing the exposed substrate; and
    processing the developed substrate to manufacture the article,
    wherein the exposure apparatus exposes a shot region on the substrate to first pulsed light, the apparatus including:
    a projection optical system configured to project a pattern onto the substrate and including an optical element configured to guide the first pulsed light to the substrate;
    an irradiation device configured to irradiate the optical element with second pulsed light having an infrared wavelength; and
    a controller configured to control the irradiation device such that the irradiation device irradiates the optical element with the second pulsed light in a period between successive two of the first pulsed light in a period of exposing the shot region to the first pulsed light plural times.

14. An exposure apparatus for exposing a shot region on a substrate to first pulsed light, the apparatus comprising:
a projection optical system configured to project a pattern onto the substrate and including an optical element configured to guide the first light pulsed light to the substrate;
an irradiation device configured to irradiate the optical element with second pulsed light having an infrared wavelength; and
a controller configured to control the irradiation device such that the irradiation device irradiates the optical element with the second pulsed light in a period between successive two of the first pulsed light in a period of exposing the shot region to the first pulsed light plural times.

15. The apparatus according to claim 14, wherein the projection optical system is configured to project the pattern of a reticle onto the substrate.

16. The apparatus according to claim 15, further comprising a reticle stage configured to hold the reticle, and a substrate stage configured to hold the substrate.

17. An exposure method of exposing a shot region on a substrate to first pulsed light via a projection optical system for projecting a pattern onto the substrate, the method comprising:
a step of exposing the shot region to light by irradiating the shot region with the first pulsed light plural times via an optical element of the projection optical system, wherein the optical element is irradiated with second pulsed light having a wavelength different from that of the first pulsed light in a period between successive two of the first pulsed light in the step of exposing the shot region to the first pulsed light plural times.

18. A method of manufacturing an article, the method comprising steps of:
exposing a substrate to light using an exposure apparatus;
developing the exposed substrate; and
processing the developed substrate to manufacture the article,
wherein the exposure apparatus exposes a shot region on the substrate to first pulsed light, the apparatus including:
a projection optical system configured to project a pattern onto the substrate and including an optical element configured to guide the first pulsed light to the substrate;
an irradiation device configured to irradiate the optical element with second pulsed light having a wavelength different from that of the first pulsed light; and
a controller configured to control the irradiation device such that the irradiation device irradiates the optical element with the second pulsed light in a period between successive two of the first pulsed light in a period of exposing the shot region to the first pulsed light plural times.

19. An exposure apparatus for exposing a shot region on a substrate to first pulsed light, the apparatus comprising:
a projection optical system configured to project a pattern onto the substrate and including an optical element configured to guide the first pulsed light to the substrate;
an irradiation device configured to irradiate the optical element with second pulsed light having a wavelength different from that of the first pulsed light; and
a controller configured to control the irradiation device such that the irradiation device irradiates the optical element with the second pulsed light in a period between successive two of the first pulsed light in a period of exposing the shot region to the first pulsed light plural times.

20. The apparatus according to claim 19, wherein the second pulsed light has an infrared wavelength.

21. An exposure apparatus for exposing a shot region on a substrate to first pulsed light having a wavelength not shorter than 1 nm and shorter than 450nm, the apparatus comprising:
a projection optical system configured to project a pattern on a reticle onto the substrate with the first pulsed light, and including an optical element configured to guide the first pulsed light between the reticle and the substrate;
an irradiation device configured to irradiate the optical element with second pulsed light having an infrared wavelength; and
a controller configured to control the irradiation device such that the optical element is irradiated with the second pulsed light in only a latter half of a non-irradiation period between successive two irradiation of the first pulsed light in an exposure period of exposing the shot region to the first pulsed light plural times.

22. The apparatus according to claim 21, wherein the controller is configured to control the irradiation device such that the irradiation device irradiates the optical element with the second pulsed light before start of exposing the shot region to the first pulsed light.

23. The apparatus according to claim 21, wherein the controller is configured to control the irradiation device such that the irradiation device irradiates the optical element with the second pulsed light in each of a plurality of the non-irradiation periods.

24. The apparatus according to claim 21, wherein the controller is configured to control the irradiation device such that the irradiation device irradiates the optical element with the second pulsed light once in the non-irradiation period.

25. The apparatus according to claim 21, wherein the controller is configured to control the irradiation device such that the irradiation device irradiates the optical element with the second pulsed light immediately before exposing the shot region to the first pulsed light in the latter half of the non-irradiation period.

26. The apparatus according to claim 21, wherein the optical element is a reflective optical element, and
the irradiation device is configured to irradiate the optical element with the second pulsed light such that the second pulsed light reflected by the optical element travels in a direction opposite to an incidence direction of the first pulsed light incident on the optical element.

27. The apparatus according to claim 21, wherein the optical element is a reflective optical element, and
the irradiation device includes an optical member for guiding the second pulsed light reflected by the optical element to a light source which emits the first pulsed light.

28. The apparatus according to claim 21, further comprising a chamber configured to house the optical element,
wherein the optical element is a reflective optical element, and
the irradiation device includes an absorbing member arranged in the chamber and configured to absorb the second pulsed light reflected by the optical element.

29. The apparatus according to claim 28, wherein the irradiation device includes a cooling device configured to cool the absorbing member.

30. The apparatus according to claim 21, further comprising a chamber configured to house the optical element,
wherein the optical element is a reflective optical element, and
the chamber includes a transmitting portion thereof configured to transmit the second pulsed light reflected by the optical element.

31. The apparatus according to claim 21, further comprising a reticle stage configured to hold the reticle, and a substrate stage configured to hold the substrate.

32. An exposure method of exposing a shot region on a substrate to first pulsed light, having a wavelength not shorter than 1 nm and shorter than 450 nm, via a projection optical system including an optical element and projecting a pattern on a reticle onto the substrate, the method comprising steps of:
  exposing the shot region to the first pulsed light plural times via the projection optical system,
  wherein the optical element is irradiated with second pulsed light having an infrared wavelength in only a latter half of a non-irradiation period between successive two irradiation of the first pulsed light in an exposure period of exposing the shot region to the first pulsed light plural times.

33. A method of manufacturing an article, the method comprising steps of:
  exposing a substrate to light using an exposure apparatus;
  developing the exposed substrate; and
  processing the developed substrate to manufacture the article,
  wherein the exposure apparatus exposes a shot region on the substrate to first pulsed light having a wavelength not shorter than 1 nm and shorter than 450 nm, and includes:
  a projection optical system configured to project a pattern on a reticle onto the substrate with the first pulsed light, and including an optical element configured to guide the first pulsed light between the reticle and the substrate;
  an irradiation device configured to irradiate the optical element with second pulsed light having an infrared wavelength; and
  a controller configured to control the irradiation device such that the optical element is irradiated with the second pulsed light in only a latter half of a non-irradiation period between successive two irradiation of the first pulsed light in an exposure period of exposing the shot region to the first pulsed light plural times.

* * * * *